(12) United States Patent
Goto et al.

(10) Patent No.: US 9,941,108 B2
(45) Date of Patent: *Apr. 10, 2018

(54) HIGH DOSE IMPLANTATION STRIP (HDIS) IN $H_2$ BASE CHEMISTRY

(71) Applicant: Novellus Systems, Inc., Fremont, CA (US)

(72) Inventors: Haruhiro Harry Goto, Saratoga, CA (US); David Cheung, Foster City, CA (US)

(73) Assignee: Novellus Systems, Inc., Fremont, CA (US)

( * ) Notice: Subject to any disclaimer, the term of this patent is extended or adjusted under 35 U.S.C. 154(b) by 998 days.

This patent is subject to a terminal disclaimer.

(21) Appl. No.: 14/171,564

(22) Filed: Feb. 3, 2014

(65) Prior Publication Data

US 2014/0182619 A1    Jul. 3, 2014

Related U.S. Application Data

(60) Continuation of application No. 13/462,660, filed on May 2, 2012, now Pat. No. 8,641,862, which is a
(Continued)

(51) Int. Cl.
*H01L 21/302* (2006.01)
*H01L 21/461* (2006.01)
(Continued)

(52) U.S. Cl.
CPC .......... *H01L 21/02041* (2013.01); *C01B 3/00* (2013.01); *C01B 7/20* (2013.01);
(Continued)

(58) Field of Classification Search
None
See application file for complete search history.

(56) References Cited

U.S. PATENT DOCUMENTS 4,201,579 A   5/1980   Robinson et al.
4,357,203 A   11/1982  Zelez
(Continued)

FOREIGN PATENT DOCUMENTS

CN   1402316   3/2003
CN   1720349   1/2006
(Continued)

OTHER PUBLICATIONS

U.S. Final Office Action, dated Jul. 10, 2015, issued in U.S. Appl. No. 14/066,587.
(Continued)

*Primary Examiner* — Roberts Culbert
(74) *Attorney, Agent, or Firm* — Weaver Austin Villeneuve & Sampson LLP

(57) ABSTRACT

Plasma is generated using elemental hydrogen, a weak oxidizing agent, and a fluorine containing gas. An inert gas is introduced to the plasma downstream of the plasma source and upstream of a showerhead that directs gas mixture into the reaction chamber where the mixture reacts with the high-dose implant resist. The process removes both the crust and bulk resist layers at a high strip rate, and leaves the work piece surface substantially residue free with low silicon loss.

15 Claims, 6 Drawing Sheets

Related U.S. Application Data division of application No. 12/251,305, filed on Oct. 14, 2008, now Pat. No. 8,193,096, which is a continuation-in-part of application No. 11/712,253, filed on Feb. 27, 2007, now abandoned, which is a division of application No. 11/011,273, filed on Dec. 13, 2004, now Pat. No. 7,202,176.

(51) Int. Cl.
| | |
|---|---|
| H01L 21/02 | (2006.01) |
| C01B 3/00 | (2006.01) |
| C01B 7/20 | (2006.01) |
| H01J 37/32 | (2006.01) |
| H01L 21/311 | (2006.01) |
| H01L 21/67 | (2006.01) |

(52) U.S. Cl.
CPC .. *H01J 37/32357* (2013.01); *H01L 21/31138* (2013.01); *H01L 21/67017* (2013.01); *H01J 2237/3342* (2013.01)

(56) References Cited

U.S. PATENT DOCUMENTS

| | | | |
|---|---|---|---|
| 4,699,689 A | 10/1987 | Bersin | |
| 4,861,424 A | 8/1989 | Fujimura et al. | |
| 4,961,820 A | 10/1990 | Shinagawa et al. | |
| 5,122,225 A | 6/1992 | Douglas | |
| 5,158,644 A | 10/1992 | Cheung et al. | |
| 5,292,393 A | 3/1994 | Maydan et al. | |
| 5,354,386 A | 10/1994 | Cheung et al. | |
| 5,593,541 A | 1/1997 | Wong et al. | |
| 5,626,678 A | 5/1997 | Sahin et al. | |
| 5,633,073 A | 5/1997 | Cheung et al. | |
| 5,651,860 A | 7/1997 | Li | |
| 5,660,682 A | 8/1997 | Zhao et al. | |
| 5,707,485 A | 1/1998 | Rolfson et al. | |
| 5,767,021 A | 6/1998 | Shinichi et al. | |
| 5,773,201 A | 6/1998 | Fujimura et al. | |
| 5,792,269 A | 8/1998 | Deacon et al. | |
| 5,811,358 A | 9/1998 | Tseng et al. | |
| 5,814,155 A | 9/1998 | Solis et al. | |
| 5,817,406 A | 10/1998 | Cheung et al. | |
| 5,820,685 A | 10/1998 | Kurihara et al. | |
| 5,830,775 A | 11/1998 | Maa et al. | |
| 5,844,195 A | 12/1998 | Fairbairn et al. | |
| 5,895,272 A | 4/1999 | Li | |
| 5,900,351 A | 5/1999 | Lutsic et al. | |
| 5,908,672 A | 6/1999 | Ryu et al. | |
| 5,911,834 A | 6/1999 | Fairbairn et al. | |
| 5,968,324 A | 10/1999 | Cheung et al. | |
| 5,980,770 A | 11/1999 | Ramachandran et al. | |
| 6,013,574 A | 1/2000 | Hause et al. | |
| 6,030,901 A | 2/2000 | Hopper et al. | |
| 6,039,834 A | 3/2000 | Tanaka et al. | |
| 6,045,618 A | 4/2000 | Raoux et al. | |
| 6,054,379 A | 4/2000 | Yau et al. | |
| 6,072,227 A | 6/2000 | Yau et al. | |
| 6,077,764 A | 6/2000 | Sugiarto et al. | |
| 6,083,852 A | 7/2000 | Cheung et al. | |
| 6,086,952 A | 7/2000 | Lang et al. | |
| 6,098,568 A | 8/2000 | Raoux et al. | |
| 6,107,184 A | 8/2000 | Mandal et al. | |
| 6,121,091 A | 9/2000 | Wang | |
| 6,125,788 A | 10/2000 | Hills et al. | |
| 6,127,262 A | 10/2000 | Huang et al. | |
| 6,129,091 A | 10/2000 | Lee et al. | |
| 6,130,166 A | 10/2000 | Yeh | |
| 6,156,149 A | 12/2000 | Cheung et al. | |
| 6,162,323 A | 12/2000 | Koshimizu | |
| 6,171,945 B1 | 1/2001 | Mandal et al. | |
| 6,177,347 B1 | 1/2001 | Liu et al. | |
| 6,184,134 B1 | 2/2001 | Chaudhary et al. | |
| 6,187,072 B1 | 2/2001 | Cheung et al. | |
| 6,193,802 B1 | 2/2001 | Pang et al. | |
| 6,194,628 B1 | 2/2001 | Pang et al. | |
| 6,203,657 B1 | 3/2001 | Collison et al. | |
| 6,204,192 B1 | 3/2001 | Zhao et al. | |
| 6,209,484 B1 | 4/2001 | Huang et al. | |
| 6,230,652 B1 | 5/2001 | Tanaka et al. | |
| 6,242,350 B1 | 6/2001 | Tao et al. | |
| 6,245,690 B1 | 6/2001 | Yau et al. | |
| 6,277,733 B1 | 8/2001 | Smith | |
| 6,281,135 B1 | 8/2001 | Han et al. | |
| 6,287,990 B1 | 9/2001 | Cheung et al. | |
| 6,303,523 B2 | 10/2001 | Cheung et al. | |
| 6,306,564 B1 | 10/2001 | Mullee | |
| 6,319,842 B1 | 11/2001 | Khosla et al. | |
| 6,324,439 B1 | 11/2001 | Cheung et al. | |
| 6,340,435 B1 | 1/2002 | Bjorkman et al. | |
| 6,342,446 B1 | 1/2002 | Smith et al. | |
| 6,348,725 B2 | 2/2002 | Cheung et al. | |
| 6,350,701 B1 | 2/2002 | Yamazaki | |
| 6,352,936 B1 | 3/2002 | Jehoul et al. | |
| 6,358,573 B1 | 3/2002 | Raoux et al. | |
| 6,361,707 B1 | 3/2002 | Tanaka et al. | |
| 6,365,516 B1 | 4/2002 | Frenkel et al. | |
| 6,395,092 B1 | 5/2002 | Sugiarto et al. | |
| 6,413,583 B1 | 7/2002 | Moghadam et al. | |
| 6,426,304 B1 | 7/2002 | Chien et al. | |
| 6,432,830 B1 | 8/2002 | Merry | |
| 6,448,187 B2 | 9/2002 | Yau et al. | |
| 6,465,352 B1 | 10/2002 | Aoki | |
| 6,465,964 B1 | 10/2002 | Taguchi et al. | |
| 6,511,903 B1 | 1/2003 | Yau et al. | |
| 6,511,909 B1 | 1/2003 | Yau et al. | |
| 6,517,913 B1 | 2/2003 | Cheung et al. | |
| 6,537,422 B2 | 3/2003 | Sakuma et al. | |
| 6,537,929 B1 | 3/2003 | Cheung et al. | |
| 6,541,282 B1 | 4/2003 | Cheung et al. | |
| 6,555,472 B2 | 4/2003 | Aminpur | |
| 6,562,544 B1 | 5/2003 | Cheung et al. | |
| 6,562,690 B1 | 5/2003 | Cheung et al. | |
| 6,569,257 B1 | 5/2003 | Nguyen et al. | |
| 6,593,247 B1 | 7/2003 | Huang et al. | |
| 6,596,655 B1 | 7/2003 | Cheung et al. | |
| 6,632,735 B2 | 10/2003 | Yau et al. | |
| 6,638,875 B2 | 10/2003 | Han et al. | |
| 6,656,832 B1 | 12/2003 | Pan et al. | |
| 6,660,656 B2 | 12/2003 | Cheung et al. | |
| 6,660,663 B1 | 12/2003 | Cheung et al. | |
| 6,663,715 B1 | 12/2003 | Yuda et al. | |
| 6,667,244 B1 | 12/2003 | Cox et al. | |
| 6,669,858 B2 | 12/2003 | Bjorkman et al. | |
| 6,680,164 B2 | 1/2004 | Nguyen et al. | |
| 6,680,420 B2 | 1/2004 | Pang et al. | |
| 6,689,930 B1 | 2/2004 | Pang et al. | |
| 6,693,043 B1 | 2/2004 | Li et al. | |
| 6,709,715 B1 | 3/2004 | Lang et al. | |
| 6,720,132 B2 | 4/2004 | Tsai et al. | |
| 6,730,593 B2 | 5/2004 | Yau et al. | |
| 6,734,115 B2 | 5/2004 | Cheung et al. | |
| 6,743,737 B2 | 6/2004 | Yau et al. | |
| 6,764,940 B1 | 7/2004 | Rozbicki et al. | |
| 6,770,556 B2 | 8/2004 | Yau et al. | |
| 6,777,173 B2 | 8/2004 | Chen et al. | |
| 6,787,452 B2 | 9/2004 | Sudijono et al. | |
| 6,797,188 B1 | 9/2004 | Shen et al. | |
| 6,800,571 B2 | 10/2004 | Cheung et al. | |
| 6,806,207 B2 | 10/2004 | Huang et al. | |
| 6,837,967 B1 | 1/2005 | Berman et al. | |
| 6,848,455 B1 | 2/2005 | Shrinivisan et al. | |
| 6,858,153 B2 | 2/2005 | Bjorkman et al. | |
| 6,869,896 B2 | 3/2005 | Cheung et al. | |
| 6,900,135 B2 | 5/2005 | Somekh et al. | |
| 6,902,682 B2 | 6/2005 | Shang et al. | |
| 6,930,061 B2 | 8/2005 | Cheung et al. | |
| 7,023,092 B2 | 4/2006 | Yau et al. | |
| 7,070,657 B1 | 7/2006 | Cheung et al. | |
| 7,074,298 B2 | 7/2006 | Gondhalekar et al. | |
| 7,160,821 B2 | 1/2007 | Huang et al. | |
| 7,186,648 B1 | 3/2007 | Rozbicki et al. | |

(56) References Cited

U.S. PATENT DOCUMENTS

| | | | |
|---|---|---|---|
| 7,202,176 B1* | 4/2007 | Goto | C01B 3/00 |
| | | | 156/345.1 |
| 7,205,249 B2 | 4/2007 | Cheung et al. | |
| 7,227,244 B2 | 6/2007 | Bjorkman et al. | |
| 7,256,134 B2 | 8/2007 | Kim et al. | |
| 7,288,484 B1 | 10/2007 | Goto et al. | |
| 7,297,635 B2 | 11/2007 | Toda et al. | |
| 7,344,993 B2 | 3/2008 | Balasubramaniam et al. | |
| 7,390,755 B1 | 6/2008 | Chen et al. | |
| 7,432,209 B2 | 10/2008 | Delgadino et al. | |
| 7,465,680 B2 | 12/2008 | Chen et al. | |
| 7,468,326 B2 | 12/2008 | Chen et al. | |
| 7,556,712 B2 | 7/2009 | Yi et al. | |
| 7,560,377 B2 | 7/2009 | Cheung et al. | |
| 7,569,492 B1 | 8/2009 | Chen et al. | |
| 7,585,777 B1 | 9/2009 | Goto et al. | |
| 7,595,005 B2 | 9/2009 | Balasubramaniam | |
| 7,597,816 B2 | 10/2009 | Chang et al. | |
| 7,601,272 B2 | 10/2009 | Nguyen et al. | |
| 7,628,864 B2 | 12/2009 | Moriya et al. | |
| 7,651,949 B2 | 1/2010 | Jo | |
| 7,740,768 B1 | 6/2010 | Goto et al. | |
| 7,799,685 B2 | 9/2010 | Savas | |
| 8,034,176 B2 | 10/2011 | Tuskamoto et al. | |
| 8,058,178 B1 | 11/2011 | Goto et al. | |
| 8,058,181 B1 | 11/2011 | Chen et al. | |
| 8,097,527 B2 | 1/2012 | Yang | |
| 8,129,281 B1 | 3/2012 | Cheung et al. | |
| 8,173,547 B2 | 5/2012 | Winniczek et al. | |
| 8,193,096 B2* | 6/2012 | Goto | C01B 3/00 |
| | | | 216/67 |
| 8,435,895 B2 | 5/2013 | Chen et al. | |
| 8,444,869 B1 | 5/2013 | Goto et al. | |
| 8,591,661 B2 | 11/2013 | Cheung et al. | |
| 8,598,037 B2 | 12/2013 | Winniczek et al. | |
| 8,641,862 B2 | 2/2014 | Goto et al. | |
| 8,716,143 B1 | 5/2014 | Cheung et al. | |
| 8,721,797 B2 | 5/2014 | Cheung et al. | |
| 9,373,497 B2 | 6/2016 | Chen et al. | |
| 9,514,954 B2 | 12/2016 | Thedjoisworo et al. | |
| 9,564,344 B2 | 2/2017 | Cheung et al. | |
| 9,613,825 B2 | 4/2017 | Shaviv et al. | |
| 2001/0014529 A1 | 8/2001 | Chen et al. | |
| 2001/0027023 A1 | 10/2001 | Ishihara | |
| 2002/0000202 A1 | 1/2002 | Yuda et al. | |
| 2002/0005392 A1 | 1/2002 | Luo et al. | |
| 2002/0039625 A1 | 4/2002 | Powell et al. | |
| 2002/0045331 A1 | 4/2002 | Aminpur | |
| 2002/0072016 A1 | 6/2002 | Chen et al. | |
| 2002/0078976 A1 | 6/2002 | Nguyen | |
| 2002/0081854 A1 | 6/2002 | Morrow et al. | |
| 2002/0090827 A1 | 7/2002 | Yokoshima | |
| 2002/0111041 A1 | 8/2002 | Annapragada et al. | |
| 2002/0132486 A1 | 9/2002 | Williams et al. | |
| 2002/0139775 A1 | 10/2002 | Chang et al. | |
| 2002/0151156 A1 | 10/2002 | Hallock et al. | |
| 2002/0153099 A1 | 10/2002 | Wang et al. | |
| 2002/0185151 A1 | 12/2002 | Qingyuan et al. | |
| 2002/0185226 A1 | 12/2002 | Lea et al. | |
| 2002/0187643 A1 | 12/2002 | Gu et al. | |
| 2002/0197870 A1 | 12/2002 | Johnson | |
| 2003/0036284 A1 | 2/2003 | Chou et al. | |
| 2003/0045115 A1 | 3/2003 | Fang | |
| 2003/0045131 A1 | 3/2003 | Verbeke et al. | |
| 2004/0084412 A1 | 5/2004 | Waldfried et al. | |
| 2004/0209469 A1 | 10/2004 | Harada et al. | |
| 2004/0237997 A1 | 12/2004 | Rui et al. | |
| 2004/0245091 A1 | 12/2004 | Karim et al. | |
| 2004/0248414 A1 | 12/2004 | Tsai et al. | |
| 2005/0022839 A1 | 2/2005 | Savas et al. | |
| 2005/0026430 A1 | 2/2005 | Kim et al. | |
| 2005/0079723 A1 | 4/2005 | Niimi et al. | |
| 2005/0106888 A1 | 5/2005 | Chiu et al. | |
| 2005/0158667 A1 | 7/2005 | Nguyen et al. | |
| 2005/0196967 A1 | 9/2005 | Savas et al. | |
| 2006/0046482 A1 | 3/2006 | Verhaverbeke | |
| 2006/0051881 A1 | 3/2006 | Ditizio | |
| 2006/0102197 A1 | 5/2006 | Chiang et al. | |
| 2006/0138399 A1 | 6/2006 | Itano et al. | |
| 2006/0141758 A1 | 6/2006 | Naumann et al. | |
| 2006/0154471 A1 | 7/2006 | Minami | |
| 2006/0163202 A1 | 7/2006 | Shimitz | |
| 2006/0182875 A1 | 8/2006 | Ose et al. | |
| 2006/0191478 A1 | 8/2006 | Gondhalekar et al. | |
| 2006/0201623 A1 | 9/2006 | Yoo | |
| 2006/0289384 A1 | 12/2006 | Pavel et al. | |
| 2007/0037396 A1 | 2/2007 | Verhaverbeke | |
| 2007/0040172 A1 | 2/2007 | Kawakami et al. | |
| 2007/0068900 A1 | 3/2007 | Kim et al. | |
| 2007/0144673 A1 | 6/2007 | Yeom | |
| 2007/0173066 A1 | 7/2007 | Kokura et al. | |
| 2007/0178698 A1 | 8/2007 | Okita et al. | |
| 2007/0224826 A1 | 9/2007 | Delgadino et al. | |
| 2007/0235137 A1 | 10/2007 | Tsukamoto et al. | |
| 2007/0281491 A1 | 12/2007 | Kamp | |
| 2008/0026589 A1 | 1/2008 | Hubacek et al. | |
| 2008/0044995 A1 | 2/2008 | Kang et al. | |
| 2008/0102646 A1 | 5/2008 | Kawaguchi et al. | |
| 2008/0153306 A1* | 6/2008 | Cho | H01L 21/31138 |
| | | | 438/712 |
| 2008/0160729 A1 | 7/2008 | Krueger et al. | |
| 2008/0248656 A1 | 10/2008 | Chen et al. | |
| 2008/0286697 A1 | 11/2008 | Verhaverbeke et al. | |
| 2009/0053901 A1 | 2/2009 | Goto et al. | |
| 2009/0056875 A1 | 3/2009 | Goto et al. | |
| 2009/0061623 A1 | 3/2009 | Chang et al. | |
| 2009/0117746 A1 | 5/2009 | Masuda | |
| 2009/0200268 A1 | 8/2009 | Tappan et al. | |
| 2009/0221148 A1 | 9/2009 | Uda et al. | |
| 2009/0277472 A1 | 11/2009 | Rivkin et al. | |
| 2009/0277871 A1 | 11/2009 | Berry et al. | |
| 2010/0015812 A1 | 1/2010 | Nishikawa | |
| 2010/0062591 A1 | 3/2010 | Lin et al. | |
| 2010/0130017 A1 | 5/2010 | Luo et al. | |
| 2010/0216312 A1 | 8/2010 | Yamamoto et al. | |
| 2010/0308463 A1 | 12/2010 | Yu et al. | |
| 2011/0006034 A1 | 1/2011 | Hilkene et al. | |
| 2011/0031493 A1 | 2/2011 | Yamazaki et al. | |
| 2011/0139175 A1 | 6/2011 | Cheung et al. | |
| 2011/0139176 A1 | 6/2011 | Cheung et al. | |
| 2011/0143548 A1 | 6/2011 | Cheung et al. | |
| 2011/0223756 A1 | 9/2011 | Schaeffer | |
| 2012/0211462 A1 | 8/2012 | Zhang et al. | |
| 2012/0211473 A1 | 8/2012 | Goto et al. | |
| 2013/0048014 A1 | 2/2013 | Shaviv et al. | |
| 2013/0157465 A1 | 6/2013 | Chen et al. | |
| 2014/0080309 A1 | 3/2014 | Park et al. | |
| 2014/0120733 A1 | 5/2014 | Cheung et al. | |
| 2015/0332933 A1 | 11/2015 | Cheung et al. | |
| 2015/0357202 A1 | 12/2015 | Thedjoisworo et al. | |

FOREIGN PATENT DOCUMENTS

| | | |
|---|---|---|
| CN | 1815697 A | 8/2006 |
| CN | 1868043 | 11/2006 |
| CN | 101015042 | 8/2007 |
| CN | 101057314 A | 10/2007 |
| CN | 101131928 | 2/2008 |
| EP | 0 304 068 | 2/1989 |
| EP | 1 077 476 | 2/2001 |
| EP | 1 081 754 | 7/2001 |
| EP | 1 956 638 | 8/2008 |
| GB | 2300303 A | 10/1996 |
| JP | S64-048418 A | 2/1989 |
| JP | H01-200628 | 8/1989 |
| JP | H05-275326 | 10/1993 |
| JP | H06-208972 | 7/1994 |
| JP | 08-293487 | 11/1996 |
| JP | H09-36099 | 2/1997 |
| JP | H10-209118 A | 8/1998 |
| JP | H11-087307 A | 3/1999 |
| JP | 2000-286248 A | 10/2000 |
| JP | 2000-352827 A | 12/2000 |
| JP | 2001-110775 A | 4/2001 |

(56) References Cited

FOREIGN PATENT DOCUMENTS

| JP | 2001-189305 A | 7/2001 |
|---|---|---|
| JP | 2001-308078 | 11/2001 |
| JP | 2003-100718 | 4/2003 |
| JP | 2003-264170 | 9/2003 |
| JP | 2005-268312 A | 9/2005 |
| JP | 2006-073612 | 3/2006 |
| JP | 2006-351594 | 12/2006 |
| JP | 2007-019367 | 1/2007 |
| JP | 2007-53344 | 3/2007 |
| JP | 2007-109744 A | 4/2007 |
| JP | 2007-515781 A | 6/2007 |
| JP | 2007-266610 | 10/2007 |
| JP | 2008-218997 | 9/2008 |
| JP | 2008-300704 | 12/2008 |
| JP | 2009-094115 A | 4/2009 |
| JP | 2010-098279 A | 4/2010 |
| KR | 1992-0003313 B1 | 4/1992 |
| KR | 10-2004-0103073 | 12/2004 |
| KR | 10-2007-0021086 A | 2/2007 |
| KR | 10-2007-00863312 A | 8/2007 |
| KR | 10-2009-0094368 A | 9/2009 |
| TW | 387097 | 4/2000 |
| TW | 200535277 | 11/2005 |
| WO | WO 2004/051702 | 6/2004 |
| WO | WO 2004/102640 | 11/2004 |
| WO | WO 2005/017983 | 2/2005 |
| WO | WO 2006/028858 | 3/2006 |
| WO | WO 2011/071980 | 6/2011 |
| WO | WO 2011/072042 | 6/2011 |
| WO | WO 2011/072061 | 6/2011 |
| WO | WO 2012/018375 | 2/2012 |

OTHER PUBLICATIONS

U.S. Office Action dated Sep. 4, 2015, issued in U.S. Appl. No. 13/590,083.
Korean Office Action (Final Rejection) dated Sep. 8, 2015, issued in Application No. 2008-0116792.
Chinese Second Office Action dated Jun. 3, 2015 issued in CN Application No. 201080056124.1.
Japanese Office Action (Notice of Reasons for Rejection) dated Sep. 1, 2015 issued in JP 2012-543229.
Taiwan Office Action [Decision] dated Jul. 14, 2015, issued in Application No. 099143368.
Chinese Second Office Action dated Jun. 23, 2015 issued in CN 201080055428.6.
Taiwan Office Action dated Jun. 16, 2015 issued in Application No. 099143366.
U.S. Appl. No. 13/274,638, filed Oct. 17, 2011, entitled "Photoresist Strip Method for Low-K Dielectrics."
U.S. Appl. No. 14/066,587, filed Oct. 29, 2013, entitled "Low Damage Photoresist Strip Method for Low-K Dielectrics."
U.S. Appl. No. 13/370,689, filed Feb. 10, 2012, entitled "Plasma Based Photoresist Removal System for Cleaning Post Ash Residue".
U.S. Office Action, dated Jul. 27, 2005, issued in U.S. Appl. No. 10/890,653.
U.S. Final Office Action, dated Jan. 10, 2006, issued in U.S. Appl. No. 10/890,653.
U.S. Office Action, dated Jun. 26, 2006, issued in U.S. Appl. No. 10/890,653.
U.S. Office Action, dated Oct. 11, 2006, issued in U.S. Appl. No. 10/890,653.
U.S. Office Action, dated Apr. 5, 2007, issued in U.S. Appl. No. 10/890,653.
U.S. Notice of Allowance, dated Jun. 15, 2007, issued in U.S. Appl. No. 10/890,653.
U.S. Supplemental Notice of Allowance, dated Jul. 23, 2007, issued in U.S. Appl. No. 10/890,653.
U.S. Office Action, dated Oct. 6, 2008, issued in U.S. Appl. No. 11/859,727.
U.S. Notice of Allowance, dated May 1, 2009, issued in U.S. Appl. No. 11/859,727.
U.S. Office Action, dated Nov. 5, 2010, issued in U.S. Appl. No. 12/533,461.
U.S. Final Office Action, dated May 26, 2011, issued in U.S. Appl. No. 12/533,461.
U.S. Notice of Allowance, dated Aug. 12, 2011, issued in U.S. Appl. No. 12/533,461.
U.S. Office Action dated Feb. 15, 2013, U.S. Appl. No. 13/274,638.
U.S. Notice of Allowance, dated Nov. 28, 2006, issued in U.S. Appl. No. 11/011,273.
U.S. Office Action, dated Dec. 23, 2008, issued in U.S. Appl. No. 11/712,253.
U.S. Office Action, dated Jul. 17, 2009, issued in U.S. Appl. No. 11/712,253.
U.S. Final Office Action, dated Jan. 29, 2010, issued in U.S. Appl. No. 11/712,253.
U.S. Office Action, dated Mar. 1, 2011, issued in U.S. Appl. No. 11/712,253.
U.S. Office Action, dated Nov. 2, 2011, issued in U.S. Appl. No. 12/251,305.
U.S. Notice of Allowance, dated Feb. 17, 2012, issued in U.S. Appl. No. 12/251,305.
U.S. Office Action, dated Apr. 26, 2013, issued in U.S. Appl. No. 13/462,660.
U.S. Notice of Allowance, dated Sep. 30, 2013, issued in U.S. Appl. No. 13/462,660.
U.S. Notice of Allowance, dated Dec. 31, 2013, issued in U.S. Appl. No. 13/462,660.
U.S. Office Action, dated Jul. 11, 2003, issued in U.S. Appl. No. 10/137,096.
U.S. Final Office Action, dated Jul. 27, 2007, issued in U.S. Appl. No. 10/137,096.
U.S. Notice of Allowance, dated Jan. 15, 2008, issued in U.S. Appl. No. 10/137,096.
U.S. Office Action, dated Aug. 25, 2008, issued in U.S. Appl. No. 12/111,095.
U.S. Notice of Allowance, dated Apr. 3, 2009, issued in U.S. Appl. No. 12/111,095.
U.S. Office Action, dated Dec. 8, 2010, issued in U.S. Appl. No. 12/502,130.
U.S. Notice of Allowance, dated Aug. 12, 2011, issued in U.S. Appl. No. 12/502,130.
U.S. Office Action, dated Sep. 6, 2012, issued in U.S. Appl. No. 12/636,582.
U.S. Final Office Action, dated May 13, 2013, issued in U.S. Appl. No. 12/636,582.
U.S. Advisory Action Before the Filing of an Appeal Brief, dated Sep. 20, 2013, issued in U.S. Appl. No. 12/636,582.
U.S. Office Action, dated Dec. 4, 2013, issued in U.S. Appl. No. 12/636,582.
U.S. Office Action, dated Mar. 30, 2012, issued in U.S. Appl. No. 12/636,601.
U.S. Final Office Action, dated Sep. 5, 2012, issued in U.S. Appl. No. 12/636,601.
U.S. Office Action, dated Feb. 12, 2013, issued in U.S. Appl. No. 12/636,601.
U.S. Notice of Allowance, dated Jul. 23, 2013, issued in U.S. Appl. No. 12/636,601.
U.S. Supplemental Notice of Allowability, dated Nov. 5, 2013, issued in U.S. Appl. No. 12/636,601.
U.S. Office Action, dated Jul. 27, 2012, issued in U.S. Appl. No. 12/963,503.
U.S. Final Office Action, dated Jan. 22, 2013, issued in U.S. Appl. No. 12/963,503.
U.S. Office Action, dated Aug. 23, 2013, issued in U.S. Appl. No. 12/963,503.
Notice of Allowance, dated Feb. 17, 2010, issued in U.S. Appl. No. 11/548,801.
U.S. Office Action, dated Nov. 10, 2011, U.S. Appl. No. 12/786,230.
U.S. Final Office Action, dated Apr. 26, 2012, issued in U.S. Appl. No. 12/786,230.

(56) References Cited

OTHER PUBLICATIONS

U.S. Notice of Allowance dated Jan. 24, 2013, issued in U.S. Appl. No. 12/786,230.
U.S. Office Action, dated Sep. 13, 2006, issued in U.S. Appl. No. 11/128,930.
U.S. Final Office Action, dated Mar. 8, 2007, issued in U.S. Appl. No. 11/128,930.
U.S. Office Action, dated Mar. 19, 2007, issued in U.S. Appl. No. 11/128,930.
U.S. Office Action, dated Jun. 29, 2007, issued in U.S. Appl. No. 11/128,930.
U.S. Office Action, dated Dec. 10, 2007, issued in U.S. Appl. No. 11/128,930 dated.
U.S. Final Office Action, dated Jul. 21, 2008, issued in U.S. Appl. No. 11/128,930.
U.S. Office Action, dated Mar. 20, 2009, issued in U.S. Appl. No. 11/128,930.
U.S. Office Action, dated Sep. 17, 2009, issued in U.S. Appl. No. 11/128,930.
U.S. Office Action, dated Feb. 26, 2010, issued in U.S. Appl. No. 11/128,930.
U.S. Final Office Action, dated Sep. 9, 2010, issued in U.S. Appl. No. 11/128,930.
U.S. Office Action, dated May 10, 2011, issued in U.S. Appl. No. 11/128,930.
U.S. Notice of Allowance, dated Oct. 28, 2011, issued in U.S. Appl. No. 11/128,930.
U.S. Office Action dated Feb. 22, 2013, issued in U.S. Appl. No. 13/370,689.
U.S. Final Office Action dated Aug. 20, 2013, issued in U.S. Appl. No. 13/370,689.
U.S. Notice of Allowance dated Jan. 17, 2014, issued in U.S. Appl. No. 13/370,689.
U.S. Office Action, dated Dec. 15, 2009, issued in U.S. Appl. No. 11/696,633.
U.S. Office Action, dated May 26, 2010, issued in U.S. Appl. No. 11/696,633.
U.S. Final Office Action, dated Sep. 20, 2010, issued in U.S. Appl. No. 11/696,633.
U.S. Office Action, dated Jun. 6, 2011, issued in U.S. Appl. No. 11/696,633.
U.S. Final Office Action, dated Sep. 28, 2011, issued in U.S. Appl. No. 11/696,633.
U.S. Office Action, dated Jan. 27, 2012, issued in U.S. Appl. No. 11/696,633.
U.S. Final Office Action, dated May 15, 2012, issued in U.S. Appl. No. 11/696,633.
U.S. Notice of Allowance, dated Oct. 29, 2012, issued in U.S. Appl. No. 11/696,633.
U.S. Office Action, dated Jul. 19, 2013, issued in U.S. Appl. No. 13/759,958.
U.S. Final Office Action, dated Nov. 12, 2013, issued in U.S. Appl. No. 13/759,958.
Chinese Office Action dated Jul. 20, 2012, issued in Application No. 200810187894.4.
Chinese Office Action dated Jun. 19, 2013, issued in Application No. 200810187894.4.
Japanese Office Action dated Sep. 25, 2012, issued in Application No. 2009-018046.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
PCT International Search Report and Written Opinion, dated Jun. 27, 2011, issued in Application No. PCT/US2010/059388.
PCT International Preliminary Report on Patentability and Written Opinion, dated Jun. 21, 2012, issued in Application No. PCT/US2010/059388.
Singapore Written Opinion and Search Report, dated Feb. 2, 2012, issued in Application No. 201104086-2.
Singapore Second Written Opinion, dated Aug. 17, 2012, issued in Application No. 201104086-2.
PCT International Search Report and Written Opinion, dated Jul. 14, 2011, issued in Application No. PCT/US2010/059517.
PCT International Preliminary Report on Patentability and Written Opinion, dated Jun. 21, 2012, issued in Application No. PCT/US2010/059517.
Singapore Written Opinion, dated Jul. 15, 2013, issued in Application No. 201204092-9.
PCT International Search Report and Written Opinion, dated Jul. 13, 2011, issued in Application No. PCT/US2010/059547.
PCT International Preliminary Report on Patentability and Written Opinion, dated Jun. 21, 2012, issued in Application No. PCT/US2010/059547.
Singapore Office Action dated Aug. 1, 2013 issued in Application No. 201203361-9.
European Partial Search Report dated Apr. 17, 2013 issued in Application No. 12 18 1659.
European Partial Search Report dated Aug. 19, 2013 issued in Application No. 12 18 1659.
Chung, Woody K., (1989) "Low Damage, Downstream RF Plasma Ashing of High Energy, Heavily Doped Implanted Resists," *Semicon Korea*, Branson International Plasma Corporation, Hayward, California 94544 U.S.A., 11pp.
Chung Woody K., (1990) "Downstream Plasma Removal of Mobile Ion Impurity From $SIO_2$," *Published Proceedings of the $8^{th}$ International Plasma Processing SymposiuM*, Fall, 7 pages.
Ghandhi, Sorab K., (1983) "VLSI Fabrication Principles," by John wiley & Sons, Inc., pp. 517-520.
Kalnitsky A. and Chung W. K, "Characterization and Optimization of a Single Wafer Downstream Plasma Stripper," *Journal of the Electrochemical Society*, 135(9):2338-2341.
Kikuchi et al. (Apr. 1994) "Native Oxide Removal on Si Surfaces by NF3-Added Hydrogen and Water Vapor Plasma Downstream Treatment," *Jpn J. Appl. Phys.* 33:2207-2211, Part 1, No. 4B.
Wolf S. and Tauber R.N., (1986) (Silicon Processing for the VLSI Era, vol. 1—Process Technology, Lattice Press), pp. 539-543.
U.S. Office Action, dated Oct. 14, 2015, issued in U.S. Appl. No. 14/301,155.
U.S. Final Office Action, dated Mar. 16, 2016, issued in U.S. Appl. No. 14/301,155.
U.S. Notice of Allowance, dated Aug. 2, 2016, issued in U.S. Appl. No. 14/301,155.
U.S. Office Action, dated Sep. 16, 2015, issued in U.S. Appl. No. 14/721,977.
U.S. Final Office Action, dated May 13, 2016, issued in U.S. Appl. No. 14/721,977.
U.S. Notice of Allowance, dated Sep. 28, 2016, issued in U.S. Appl. No. 14/721,977.
U.S. Final Office Action dated Jan. 25, 2016, issued in U.S. Appl. No. 13/590,083.
U.S. Office Action dated Jun. 8, 2016, issued in U.S. Appl. No. 13/590,083.
U.S. Notice of Allowance dated Nov. 16, 2016, issued in U.S. Appl. No. 13/590,083.
Korean Office Action dated Nov. 19, 2015, issued in Application No. KR 2008-0116792.
Korean Notice of Scheduled date of Ruling mailed Oct. 18, 2016, for Application No. KR 2008-0116792.
Chinese Third Office Action dated Dec. 10, 2015 issued in Application No. CN 201080056124.1.
Chinese Fourth Office Action dated Jun. 14, 2016 issued in Application No. CN 201080056124.1.
Taiwan Office Action and Search Report, dated Nov. 20, 2015, issued in Application No. TW 099143367.
Chinese Third Office Action dated Sep. 28, 2015 issued in Application No. CN 201080056102.5.
Japanese Office Action [Decision of Rejection] dated Sep. 8, 2015 issued in Application No. JP 2012-543254.
Korean Office Action dated Nov. 16, 2016 issued in Application No. 10-2012-7015129.
Chinese Third Office Action dated Jan. 4, 2016 issued in Application No. CN 201080055428.6.

(56) References Cited

OTHER PUBLICATIONS

Chinese Fourth Office Action dated Apr. 5, 2016 issued in Application No. CN 201080055428.6.
Korean Office Action dated Nov. 21, 2016 issued in Application No. KR 10-2012-7017871.
Japanese Office Action dated Sep. 20, 2016 issued in Application No. JP 2012-186425.
Taiwan Office Action and Search Report dated Oct. 4, 2016 issued in Application No. TW 101130809.
U.S. Appl. No. 14/301,155, filed Jun. 10, 2014, entitled "Peroxide-Vapor Treatment for Enhancing Photoresist-Strip Performance and Modifying Organic Films."
U.S. Office Action, dated Aug. 13, 2014, issued in U.S. Appl. No. 12/636,582.
U.S. Final Office Action, dated Feb. 26, 2015, issued in U.S. Appl. No. 12/636,582.
U.S. Office Action, dated Apr. 10, 2014, issued in U.S. Appl. No. 14/066,587.
U.S. Final Office Action, dated Oct. 9, 2014, issued in U.S. Appl. No. 14/066,587.
U.S. Office Action, dated Mar. 18, 2015, issued in U.S. Appl. No. 14/066,587.
U.S. Notice of Allowance, dated Feb. 12, 2014, issued in U.S. Appl. No. 12/963,503.
U.S. Office Action dated Oct. 9, 2014, issued in U.S. Appl. No. 13/590,083.
U.S. Final Office Action dated Apr. 27, 2015, issued in U.S. Appl. No. 13/590,083.
U.S. Notice of Allowance, dated Apr. 28, 2014, issued in U.S. Appl. No. 13/759,958.
U.S. Notice of Allowance, dated Sep. 22, 2014, issued in U.S. Appl. No. 13/759,958.
Korean Office Action dated Feb. 25, 2015, issued in Application No. 2008-0116792.
Taiwan Search Report dated Feb. 17, 2014 issued in TW 097146496.
Taiwan Office Action dated Jun. 19, 2014 issued in TW 097146496.
Chinese First Office Action dated Sep. 24, 2014 issued in CN Application No. 201080056124.1.
Japanese Office Action dated Nov. 11, 2014 issued in JP 2012-543229.
Chinese First Office Action and Search Report dated Aug. 5, 2014 issued in CN 201080056102.5.
Chinese Second Office Action and Search Report dated Feb. 13, 2015 issued in CN 201080056102.5.
Japanese Office Action dated Nov. 11, 2014 issued in JP 2012-543254.
Singapore Examination Report, dated Mar. 21, 2014, issued in Application No. 201204092-9.
Taiwan Office Action dated Mar. 23, 2015, issued in Application No. 099143368.
Chinese First Office Action and Search Report dated Sep. 1, 2014 issued in CN 201080055428.6.
Japanese Office Action dated Oct. 28, 2014 issued in JP 2012-543261.
Singapore Second Written Opinion dated Apr. 5, 2014 issued in Application No. 201203361-9.
Singapore Final Examination Report dated Nov. 3, 2014 issued in Application No. 201203361-9.
Singapore Search Report and Written Opinion dated Dec. 13, 2013 issued in SG 201206236-0.
Singapore Search and Examination Report dated Jul. 7, 2014, issued in SG 201206236-0.
Abe et al. (Aug. 2003) "Novel photoresist stripping technology using ozone/vaporized water mixture," IEEE Trans. Semicon. Manufact., 16(3):401-408.
De Gendt et al. (1999) "A Novel Resist and Post-Etch Residue Removal Process Using Ozonated Chemistry," Solid State Phenomena vols. 65-66:165-168.
Noda et al. (2003) "Development of a Photoresist Removal Method Using Ozone Gas with Water Vapor for LCD Manufacturing," J. Electrochem. Soc. 150(9):G537-G542.
Korean Office Action [Trial Decision] dated Jun. 26, 2017, issued in Application No. KR 2008-0116792.
Korean Final Office Action dated May 17, 2017 issued in Application No. 10-2012-7015129.
Chinese First Office Action dated Jun. 8, 2017 issued in Application No. 201210308821.2.
Japanese Second Office Action dated Mar. 7, 2017 issued in Application No. JP 2012-186425.

* cited by examiner

HIGH DOSE IMPLANTATION STRIP (HDIS) IN H$_2$ BASE CHEMISTRY

CROSS REFERENCE TO RELATED U.S. APPLICATIONS

This application is a continuation of and claims priority to U.S. patent application Ser. No. 13/462,660, filed May 2, 2012, titled "High Dose Implantation Strip (HDIS) in H2 Base Chemistry," which is a divisional of U.S. patent application Ser. No. 12/251,305, issued as U.S. Pat. No. 8,193,096, filed Oct. 14, 2008, titled "High Dose Implantation Strip (HDIS) in H2 Base Chemistry," which is a continuation-in-part of U.S. patent application Ser. No. 11/712,253, filed Feb. 27, 2007, titled "Enhanced Stripping of Low-K Films Using Downstream Gas Mixing," which is a divisional of U.S. patent application Ser. No. 11/011,273, issued as U.S. Pat. No. 7,202,176, filed Dec. 13, 2004, and titled "Enhanced Stripping of Low-K Films Using Downstream Gas Mixing." All of these applications are incorporated herein by this reference in their entireties and for all purposes.

FIELD OF INVENTION

The present invention pertains to methods and apparatuses to remove or strip photoresist material and removing related residues from a work piece surface. Particularly, this application relates to methods and apparatus for stripping resist after ion implant or plasma assisting doping implant (low dose or high-dose implanted resist).

BACKGROUND

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting are performed on the uncovered surface and the remaining photoresist. After performing one or more semiconductor processes, the remaining photoresist is removed in a strip operation.

During ion implantation, dopant ions, e.g., ions of boron, boron difluoride, indium, gallium, thallium, phosphorous, arsenic, antimony, bismuth, or germanium, are accelerated toward a work piece target. The ions implant in exposed regions of the work piece as well as in the remaining photoresist surface. The process may form well regions (source/drain) and lightly doped drain (LDD) and doubled diffused drain (DDD) regions. The ion implant impregnates the resist with the implant species and depletes the surface of hydrogen. The outer layer or crust of the resist forms a carbonized layer that may be much denser than the underlying bulk resist layer. These two layers have different thermal expansion rates and react to stripping processes at different rates.

The difference between the outer layer and bulk layer is quite pronounced in post high-dose ion implant resist. In high-dose implantation, the ion dose may be greater than $1\times10^{15}$ ions/cm$^2$ and the energy may be from 10 Kev to greater than 100 keV. Traditional high dose implantation strip (HDIS) processes employ oxygen chemistries where monatomic oxygen plasma is formed away from the process chamber and then directed at the work piece surface. The reactive oxygen combines with the photoresist to form gaseous by-products which is removed with a vacuum pump. For HDIS, additional gases are needed to remove the implanted dopants with oxygen.

Primary HDIS considerations include strip rate, amount of residue, and film loss of the exposed and underlying film layer. Residues are commonly found on the substrate surface after HDIS and stripping. They may result from sputtering during the high-energy implant, incomplete removal of crust, and/or oxidation of implant atoms in the resist. After stripping, the surface should be residue free or substantially residue free to ensure high yield and eliminate the need for additional residue removal processing. Residues may be removed by overstripping, i.e., a continuation of the strip process past the point nominally required to remove all photoresist. Unfortunately, in conventional HDIS operations, overstripping sometimes removes some of the underlying functional device structure. At the device layer, even very little silicon loss from the transistor source/drain regions may adversely affect device performance and yield, especially for ultra shallow junction devices fabricated at the <32 nm design rule or below.

What is needed therefore are improved and methods and apparatus for stripping photoresist and ion implant related residues, especially for HDIS, which minimizes silicon loss and leaves little or no residue while maintaining an acceptable strip rate.

SUMMARY OF THE INVENTION

The present invention addresses the aforementioned need by providing improved methods and an apparatus for stripping photoresist and removing ion implant related residues from a work piece surface. Plasma is generated using elemental hydrogen, a weak oxidizing agent, and a fluorine containing gas. In certain embodiments, an inert gas is introduced to the plasma downstream of the plasma source and upstream of a showerhead, which directs gas into the reaction chamber. The plasma-activated gases flowing together with the inert gas reacts with the high-dose implant resist, removing both the crust and bulk resist layers, leaving the work piece surface substantially residue free with low silicon loss.

In one aspect of the invention, methods involve removing material from a work piece in a process chamber according to the following operations: introducing a gas comprising elemental hydrogen, a weak oxidizing agent, and a fluorine containing gas into a plasma source, generating a plasma from the gas introduced into the plasma source, and introducing an inert gas downstream of the plasma source and upstream of the work piece. The plasma-activated gas travels toward a work piece, and is combined with the inert gas upstream of a showerhead in the reaction chamber. The electrically charged species in the plasma may be discharged or partially discharged when they contact the showerhead.

The plasma-activated gas comprising elemental hydrogen, the weak oxidizing agent, and the fluorine containing gas flows, together with the inert gas, to the work piece and reacts with the material from the work piece. Examples of weak oxidizing agents include carbon dioxide, carbon monoxide, nitrogen dioxide, nitrogen oxide, water, hydrogen peroxide, or combinations of these. The weak oxidizing agent is preferably carbon dioxide. The fluorine containing gas may be carbon tetrafluoride, other fluorocarbons including hydrofluorocarbons, elemental fluorine, nitrogen trifluoride, sulfur hexafluoride, combinations of these, and the like. The fluorine containing gas is preferably carbon tetrafluoride. The inert gas may be argon, helium, nitrogen, combinations of these, and the like. The preferred inert gas is argon. The gas introduced into the plasma source may be premixed or not, and may include about 1% to 99%, or about 0.1% to about 10% or about 3% to 5% by volume of the weak oxidizing agent. The inert gas may be introduced at a volumetric flow rate of about 0.15 and 10 times, or about 2 times, the volumetric flow rate of the elemental hydrogen. At the work piece, the gas may include at most about 1% by volume of the weak oxidizing agent species and about 0.1 to 0.5% by volume of the fluorine containing gas species.

In certain embodiments, the material removed from the work piece surface is a high-dose implant resist. The work piece may be a 300 mm wafer. The plasma may be remotely generated using RF power between about 300 watts and about 10 kilo-watts. The temperature of the work piece may be about 160 to 500 degrees Celsius when contacted by the gas. The process pressure may be between about 300 mTorr and 2 Torr.

According to various embodiments, the a high-dose implant resist is removed from the work piece surface at a rate that is at least about 100 nm/min and silicon is removed from the work piece surface at an overall rate of no greater than about 4 nm/min. The resulting work piece is substantially residue free of the high-dose implanted resist after removal, and less than about 3 angstroms silicon is lost from an underlying silicon layer.

Another aspect of this invention relates to multi-step methods of removing high-dose implanted resist from a work piece surface in a reaction chamber. The methods include removing a first portion of the material by introducing, at a first total flow rate, a first gas comprising elemental hydrogen, a weak oxidizing agent, and with or without a fluorine containing gas into a plasma source, generating a first plasma from the first gas introduced into the plasma source, introducing a first inert gas downstream of the plasma source and upstream of the work piece, and reacting a first portion of the material from the work piece with the mixture. The methods also include removing a second portion of the material by introducing, at a second total flow rate, a second gas comprising hydrogen and a weak oxidizing agent and with or without a fluorine containing gas into a plasma source, generating a second plasma from the second gas introduced into the plasma source, introducing a second inert gas downstream of the plasma source and upstream of the work piece, and reacting a second portion of the material from the work piece. The first and second gas compositions are different. In certain embodiments, at least one of the first or the second gas includes a fluorine containing gas. At the end of the removal process, in certain embodiments, the work piece is substantially residue free and has had less than about 3 angstroms of silicon lost from an underlying silicon layer. The removing a second portion operation may occur before removing the first portion operation. In certain embodiments, the one or more of the removing operations are repeated one or more times. These removing operations may occur in a same or different reaction stations in the reaction chamber.

In yet another aspect, the present invention pertains to an apparatus for removing material from a work piece surface comprising a reaction chamber and a controller. The reaction chamber includes a plasma source, a gas inlet for introducing a gas mixture comprising elemental hydrogen into the plasma source, a gas inlet for introducing an inert gas downstream of the plasma source and upstream of the work piece, a showerhead positioned downstream of the gas inlet, and a work piece support downstream of the showerhead. The work piece support includes a pedestal and temperature-controlling mechanism to control a temperature of a work piece supported on the work piece support. The controller is configured to execute a set of instructions, including instructions to introduce a gas comprising hydrogen, a weak oxidizing agent, and a fluorine containing gas into a plasma source, generate a plasma from the gas introduced into the plasma source, introduce an inert gas downstream of the plasma source and upstream of the work piece, and optionally to repeat the introduce a gas, generate a plasma, and introduce an inert gas instructions using different flow rates and gas compositions. The plasma source used in accordance with the methods and apparatus of the invention may be any of a number of conventional plasma sources. For example, an RF ICP source may be used.

The process chamber used in accordance with the methods and apparatus of the invention may be any suitable process chamber. The process chamber may be one chamber of a multi-chambered apparatus or it may be part of a single chamber apparatus. In certain embodiments, the reaction chamber includes a plurality of stations, where at least one station includes a plasma source, a plurality of gas inlets, a showerhead, and a work piece support.

These and other features and advantages of the present invention will be described in more detail below with reference to the associated drawings.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "work piece", "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as displays, printed circuit boards, and the like.

As mentioned previously, the methods and apparatus of the invention may be used to efficiently and effectively to remove photoresist materials after high-dose ion implantation. The invention is not limited to high-dose implant strip (HDIS). The invention is also not limited to any particular category of dopants implanted. For instance, described methods and apparatus may be effectively used with stripping after medium or low dose implant. Although specific dopant ions such as boron, arsenic, and phosphorous are discussed, the described methods and apparatus may be effectively used to strip resist impregnated with other dopants, such as nitrogen, oxygen, carbon, germanium, and aluminum.

The methods and apparatus of the present invention use plasmas that are produced from gases that contain hydrogen. The gases also contain a weak oxidizing agent and a fluorine containing gas. One skilled in the art will recognize that the actual species present in the plasma may be a mixture of different ions, radicals, and molecules derived from the hydrogen, weak oxidizing agent, and fluorine containing gas. It is noted that other species may be present in the reaction chamber, such as small hydrocarbons, carbon dioxide, water vapor and other volatile components as the plasma reacts with and breaks down the organic photoresist and other residues. One of skill in the art will also recognize that the initial gas/gases introduced into the plasma is/are often different from the gas/gases that exist in the plasma as well as the gas/gases contact the work piece surface during strip.

Figure 1:
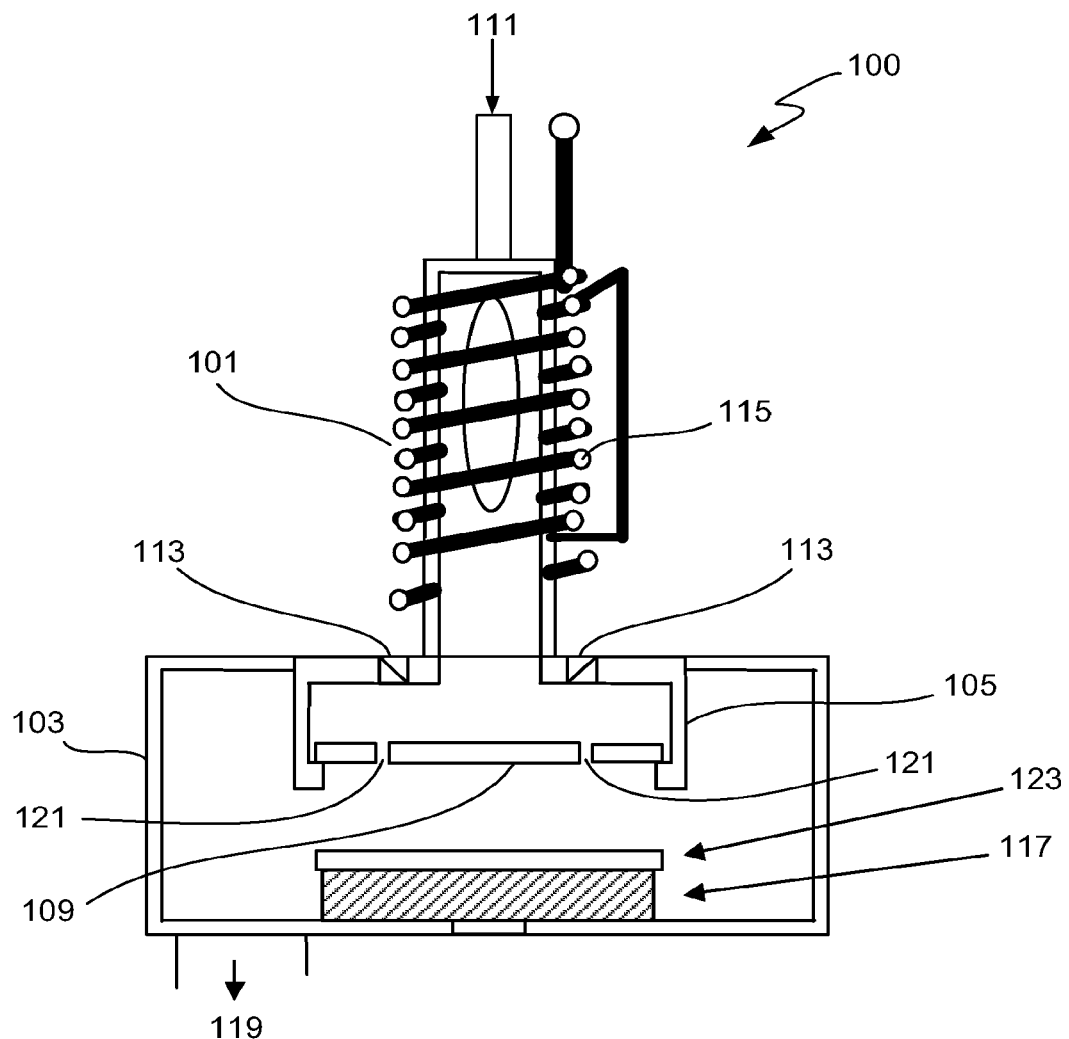
FIG. 1 is a schematic illustration showing an apparatus according to certain embodiments of the claimed invention and suitable for practicing the methods of the claimed invention.

FIG. 1 is a schematic illustration of an apparatus 100 according to certain embodiments of the claimed invention. Apparatus 100 has a plasma source 101 and a process chamber 103 separated by a showerhead assembly 105. Plasma source 101 is connected to gas inlet 111. Showerhead 109 forms the bottom of showerhead assembly 105. Inert gas inlets 113 are downstream of plasma source 101 and upstream of wafer 123 and showerhead 109. Inside process chamber 103, a wafer 123 with photoresist/dry etch byproduct material rests on a platen (or stage) 117. Platen 117 may be fitted with a temperature control mechanism that may heat or cool a wafer on the platen as necessary. In some embodiments, platen 117 is also configured for applying a bias to wafer 123. Low pressure is attained in reaction chamber 103 via vacuum pump and conduit 119.

In operation, a gas is introduced via gas inlet 111 to the plasma source 101. The gas introduced to the plasma source contains the chemically active species that will be ionized in the plasma source to form a plasma. Gas inlet 111 may be any type of gas inlet and may include multiple ports or jets. Plasma source 101 is where the active species of the gas introduced to the source are generated to form a plasma. In FIG. 1, an RF plasma source is shown with induction coils 115, which are energized to form the plasma. An inert gas is introduced via gas inlets 113 upstream of the showerhead and downstream of the plasma source. The inert gas mixes with the plasma. Gas inlets 113 may be any type of gas inlets and may include multiple ports or jets to optimize mixing the inert gas with the plasma. Showerhead 109 directs the plasma/inert gas mixture into process chamber 103 through showerhead holes 121. There may be any number and arrangement of showerhead holes 121 to maximize uniformity of the plasma/gas mixture in process chamber 103. Showerhead assembly 105, which may be electrically grounded or have an applied voltage, may capture and discharge some ions and thereby change the composition of the gas flowing into process chamber 103: i.e., the gas will contain an increased proportion of neutral species. As mentioned, wafer 123 may be temperature controlled and/or a RF bias may be applied. The plasma/inert gas mixture removes the photoresist/etch byproduct material from the wafer.

In some embodiments of the claimed invention, the apparatus does not include showerhead assembly 105 and showerhead 109. In these embodiments, the inert gas inlets 113 introduce the inert gas directly into the process chamber where it mixes with the plasma upstream of wafer 115. Various configurations and geometries of the plasma source 101 and induction coils 115 may be used. For example, induction coils 115 may loop around the plasma source 101 in an interlaced pattern. In another example, the plasma source 101 may be shaped as a dome instead of a cylinder.

Suitable plasma apparatuses include the Gamma 2100, 2130 I2CP (Interlaced Inductively Coupled Plasma), G400, and GxT offered by Novellus Systems, Inc. of San Jose, Calif. Other apparatuses include the Fusion line from Axcelis Technologies Inc. of Rockville, Maryland, the TERA21 from PSK Tech Inc. in Korea, and the Aspen tool from Mattson Technology Inc, in Fremont, Calif.

Figure 2A:
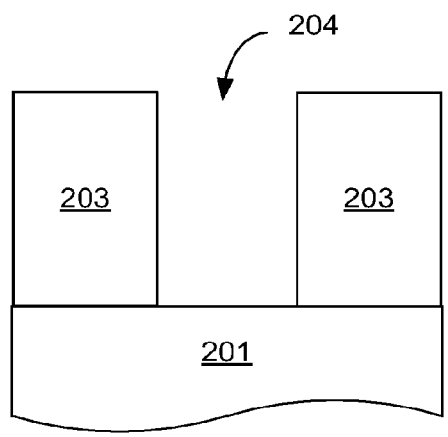
FIGS. 2A to 2D depict various stages of semiconductor fabrication before and after ion implantation and stripping operations.
Figure 2B:
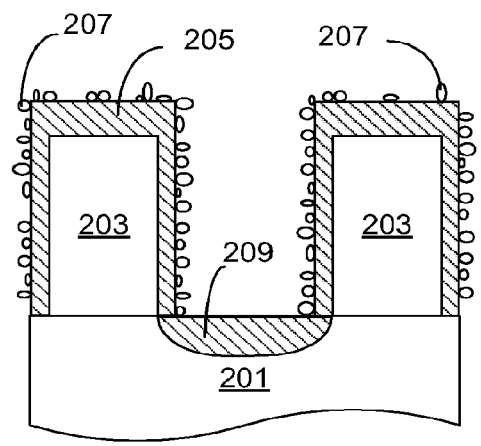

FIGS. 2A to 2D depict various stages of semiconductor fabrication before and after ion implantation and stripping operations. FIG. 2A shows a semiconductor substrate 201 coated with photoresist material 203. The substrate 201 may include one or more layers of deposited film, e.g., oxide film, silicide contact, and/or polysilicon film, or may be a bare silicon substrate, including for example a silicon-on-insulator type substrate. Initially, the photoresist material coats the entire substrate surface. The photoresist is then exposed to patterned radiation generated through a mask and developed to remove a portion of the material, e.g., the opening 204 shown in FIG. 2A between the remaining photoresist materials 203.

The substrate is then exposed to an ion implant process. During ion implant, the surface of the work piece or wafer is implanted with dopant ions. The process may be, for example, a plasma-immersion ion implantation (PIII) or ion beam implantation. The ions bombard the substrate surface, including the exposed silicon layer 201 and the photoresist 203. With high energy ion implantation, small amounts of the underlying material 207 may be sputtered to the photoresist sidewalls. See FIG. 2B. This material may include some of the implant species, other material in the plasma or ion beam, and by-products of the implantation. They include silicon, aluminum, carbon, fluorine, titanium, other contact materials such as cobalt, and oxygen in both elemental and compound form. The actual species depend on the composition of the substrate before ion implant, the photoresist, and the implanted species.

At the exposed silicon layer 201, a doped region 209 is created. The ion energy or intensity of the bombardment determines the depth or thickness of the doped region. The density of the ion flux determines the extent of doping.

The ions also impregnate the photoresist surface creating a crust layer 205. The crust layer 205 may be carbonized and highly cross-linked polymer chains. The crust is usually depleted of hydrogen and impregnated with the implant species. The crust layer 205 is denser than the bulk resist layer 203. The relative density depends on the ion flux while the thickness of the crust layer depends on the ion energy.

This crust layer 205 is harder to strip than the bulk photoresist 203 below. Removal rates of the crust layer may be 50% or 75% slower than the underlying bulk photoresist. The bulk photoresist contains relatively high levels of chemically bonded nitrogen and some of its original casting solvent. At elevated wafer temperature, e.g., above 150 to above 200° C., the bulk resist can outgas and expand relative to the crust layer. The entire photoresist can then "pop" as the underlying bulk photoresist builds up pressure under the crust. Photoresist popping is a source of particles and process defects because the residues are especially hard to clean from the wafer surface and chamber internal parts. With high-dose ion implantation, the density difference between the crust and underlying bulk photoresist layer is even higher. The crust may also be thicker.

Figure 2C:
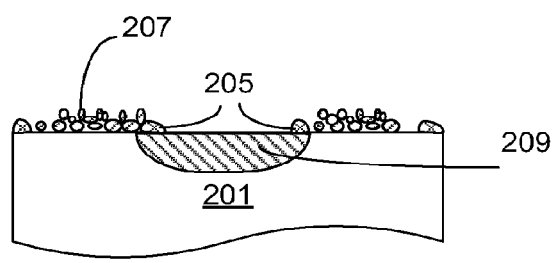

FIG. 2C shows the substrate after a strip that fails to completely remove the photo resist 205 and the sidewall sputter residue 207. The sidewall sputter residue 207 may include particles that do not form a volatile compound under conventional strip chemistries. These particles may remain after a conventional strip operation. The residue may also include oxides of implanted species formed with the reactive oxygen used in the conventional strip chemistry, such as boron oxide and arsenic oxide. Portions of the crust 205 may also remain on the substrate. Crust sidewalls and corners at the bottom of photoresist vias may be hard to strip because of geometries.

These residue particles may be removed by overstripping in some cases, using fluorinated chemistry, or wet cleaning the wafer. Overstripping in conventional oxygen chemistry has been found to cause unwanted silicon oxidation but still not remove boron oxide and arsenic oxide residues if present. Using fluorinated compounds in plasmas generated in accordance with this invention produces fluorine radicals that can form volatile boron fluoride and arsenic fluoride. This helps remove residues but may unfortunately also etch underlying silicon and silicon oxide from the substrate. Use of the particular strip fluorinated chemistries in accordance with embodiments of this invention mitigates this problem.

Silicon loss is a function of resist thickness, crust thickness, and percent overstrip. Longer and more aggressive stripping to remove thicker resist can also remove more silicon. For resist with thicker crust, the difference between the crust layer and bulk resist layer is even more pronounced. The thicker crust sidewalls and corners are even harder to strip. Thus, strip processes designed to remove thick crust also tends to remove more silicon. Overstrip may be used to address resist uniformity and geometries in addition to residue removal. Overstrip is a continuation of the strip process past the point nominally required to remove all photoresist. If the photoresist is totally removed in some areas of the wafer but not others, continuation of the strip process would cause additional material, typically silicon and silicon oxide, to be removed from areas that are already stripped. Typical overstrip is about 100%.

Figure 2D:
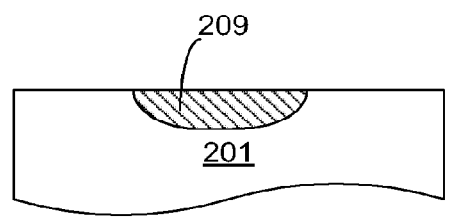

FIG. 2D shows the substrate after all the residues has been removed. Preferably, the residue is removed without additional silicon loss or oxidation and with minimum delay. Even more preferably, the strip process leaves no residue and thus reduces the number of process steps.

The disclosed process and apparatus of the present invention use a hydrogen-based plasma chemistry with a weak oxidizing agent and a fluorine-containing gas to achieve a substantially residue free strip process with minimal silicon loss. The silicon loss is believed to be reduced because fluorine radicals in the plasma combine with hydrogen in the process gas to form hydrogen fluoride (HF) instead of remaining as fluorine radicals and etching underlying silicon. A combination of carbon dioxide and carbon tetrafluoride in the plasma has been demonstrated to strip away the post high dose implant photoresist leaving the substrate residue free or substantially residue free based on a SEM inspection or a defect inspection tool such as one from KLA-Tencor of Milpitas, Calif. This is accomplished with minimal overstrip (e.g., less than about 100% overstrip). According to various embodiments, a substantially residue free condition is indicated by less than about 3% inspected die having polymer defects as detected by a defect inspection tool.

An acceptable minimum silicon loss may be about 3 angstroms or less, preferably less than about 1 angstrom. Device requirements drive this minimum silicon loss regardless of resist thickness and other factors that may affect silicon loss. To reduce measurement errors, the silicon loss is typically measured by processing a wafer through the same strip process a number of times, for example, 5 times before measuring the silicon loss on the device structure using an electronic microscope, e.g., transmission electronic microscope. The average silicon loss thus obtained is used to compare various processes.

Process Parameters

Upstream Inlet Gas

A hydrogen-containing gas, typically comprising elemental hydrogen, is introduced to the plasma source. Typically the gas introduced to the plasma source contains the chemically active species that will be ionized in the plasma source to form a plasma. The gas introduced to the plasma source includes a fluorine containing gas such as carbon tetrafluoride, other fluorocarbons including $C_2F_6$ and hydrofluorocarbons, elemental fluorine, nitrogen trifluoride, sulfur hexafluoride. In certain embodiments, the fluorine containing gas is carbon tetrafluoride. In certain specific embodiments, the gas introduced to the plasma source comprises between about 0.1% to about 3% carbon tetrafluoride by volume. The gas introduced to the plasma source may include a weak oxidizing agent such as carbon dioxide, carbon monoxide, nitrogen dioxide, nitrogen oxide and/or water. In certain embodiments, the weak oxidizing agent is carbon dioxide.

According to various embodiments, the inlet gas may include between about 1 and 99 volume percent, about 80 and 99.9 volume percent, or about 95 volume percent molecular hydrogen, between about 0 and 99 volume percent or 0 and 10 volume percent weak oxidizing agent, and between about 0.1 and 10 volume percent fluorine containing compound(s). In certain embodiments, the inlet gas may include between about 95 to 99 volume percent molecular hydrogen, between about 0.1 and 3 volume percent weak oxidizing agent, and between about 0.1 and 1 volume percent fluorine containing compound(s). In specific embodiments, the gas introduced to the plasma source comprises about 95% to 99% elemental hydrogen, about 1-3% carbon dioxide, and about 1% or less carbon tetrafluoride, all by volume.

The gas introduced to the plasma source may be premixed, partially mixed or unmixed. Individual gas sources may flow into a mixing plenum before being introduced to the plasma source. In other embodiments, the different gases may separately enter the plasma source. The gas introduced to the plasma source may have different compositions when used in different reaction stations of a multistation chamber. For example in a 6-station chamber, station 1 or station 6 may employ process gases with relatively higher amounts of fluorine containing gas to remove the crust or the residue, respectively. One or more of the other stations may employ process gases with little or no fluorine containing gas. Process gases with no carbon dioxide or weak oxidizing agents may also be used.

Methods of stripping photoresist and etch materials using hydrogen-based plasmas with weak oxidizing agents are disclosed in U.S. Pat. No. 7,288,484, which is hereby incorporated by reference in its entirety and for all purposes.

U.S. Pat. No. 7,288,484 discloses removing material from a dielectric layer after an etch process according to the following sequence of operations: (a) placing a partially fabricated integrated circuit in a reaction chamber, (b) introducing gas comprising a weak oxidizing agent and hydrogen into the reaction chamber, and (c) applying RF power to form a plasma within the reaction chamber to convert at least a portion of the material to gaseous form, thereby removing at least a portion of the material from the partially fabricated integrated circuit. In preferred embodiments, the weak oxidizing agent comprises at least one of carbon dioxide, carbon monoxide, nitrous oxide, nitric oxide and nitrogen dioxide and water. In a particularly preferred embodiment, the weak oxidizing agent comprises carbon dioxide. In preferred embodiments where carbon dioxide is used, the gas comprises between about 0.1% to about 1.0% carbon dioxide by volume. In some embodiments, the gas further comprises at least one inert carrier gas such as helium, argon or nitrogen. In preferred embodiments, the gas does not comprise molecular oxygen.

Plasma Generation

Various types of plasma sources may be used in accordance with the invention, including RF, DC, and microwave based plasma sources. In a preferred embodiment, a downstream RF plasma source is used. Typically, the RF plasma power for a 300 mm wafer ranges between about 300 Watts to about 10 Kilowatts. In some embodiments, the RF plasma power is between about 1000 Watts and 2000 Watts.

Inert Gas

Various inert gases may be used in the stripping process. As explained, these gases are introduced downstream of the plasma source and upstream of the showerhead for mixing with the plasma. In a certain embodiments, the inert gas is argon or helium. In a specific embodiment, the inert gas is argon. However, any inert gas, including nitrogen and helium, may be used. In certain embodiments, the inert gas flow rate is between about 0.15 and 10.0 times the hydrogen flow rate. In certain specific embodiments, the inert gas flow rate is between about 1 and 3 times or about 2 times the hydrogen flow rate.

Inert Gas Inlet

The inert gas inlet may be any one of various types of gas inlets and may include multiple ports or jets to facilitate mixing with the plasma. The angle of the inlet jets may also optimized to maximize mixing. In one embodiment, there are at least four inert gas inlet jets. In another embodiment, there are sixteen inlet jets. In certain specific embodiments the angle of the inlet jets, as measured from the bottom of the plasma source, is zero degrees so that the inert gas is injected perpendicular to the direction of flow of the plasma entering the showerhead assembly (or the process chamber if there is no showerhead assembly) from the plasma source. An angle of zero degrees also corresponds to a direction parallel to the face of the work piece. Of course, other inlet angles may be employed, although in many embodiments, the angles are generally parallel to the work piece face.

Showerhead Assembly

According to various embodiments of the present invention the plasma gas is distributed to the work surface via a showerhead assembly. The showerhead assembly may be grounded or have an applied voltage to attract some charge species while not affecting the flow of neutral species to the wafer, e.g., 0-1000 watt bias. Many of the electrically charged species in the plasma recombine at the showerhead. The assembly includes the showerhead itself which may be a metal plate having holes to direct the plasma and inert gas mixture into the reaction chamber. The showerhead redistributes the active hydrogen from the plasma source over a larger area, allowing a smaller plasma source to be used. The number and arrangement of the showerhead holes may be set to optimize strip rate and strip rate uniformity. If the plasma source is centrally located over the wafer, the showerhead holes are preferably smaller and fewer in the center of the showerhead in order to push the active gases toward the outer regions. The showerhead may have at least 100 holes. Suitable showerhead include the Gamma xPR showerhead or the GxT drop-in showerhead available from Novellus Systems, Inc. of San Jose, Calif.

In embodiments in which there is no showerhead assembly, the plasma and inert gas mixture enters the process chamber directly.

Process Chamber

The process chamber may be any suitable reaction chamber for the strip operation being performed. It may be one chamber of a multi-chambered apparatus or it may simply be a single chamber apparatus. The chamber may also include multiple stations where different wafers are processed simultaneously. The process chamber may be the same chamber where the implant, etch, or other resist-mediated process takes place. In other embodiments, a separate chamber is reserved for the strip. Process chamber pressure may range from about 300 mTorr to 2 Torr. In certain embodiments, the pressure ranges from about 0.9 Torr to 1.1 Torr.

The process chamber includes one or more processing stations on which strip operations are performed. In certain embodiments, the one or more processing stations includes a preheat station, at least one strip station, and an over-ash station. Various features of the process chamber and the process station are disclosed in FIG. 1 and associated text. The wafer support is configured to support the wafer during processing. The wafer support may also transfer heat to and from the wafer during processing to adjust the wafer temperature as necessary. In certain embodiments, the wafer is supported on a plurality of minimum contacts and does not physically contact the wafer support surface plane. A spindle picks up the wafer and transfers the wafer from one station to another.

Suitable plasma chambers and systems include the Gamma 2100, 2130 I$^2$CP (Interlaced Inductively Coupled Plasma), G400, and GxT offered by Novellus Systems, Inc. of San Jose, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various strip chambers may be configured onto cluster tools. For example, a strip chamber may be added to a Centura cluster tool available from Applied Materials of Santa Clara, Calif.

Work piece

In preferred embodiments, the work piece used in accordance with the methods and apparatus of the invention is a semiconductor wafer. Any size wafer may be used. Most modern wafer fabrication facilities use either 200 mm or 300 mm wafers. As disclosed above, the process and apparatus disclosed herein strips photoresist after a processing operation such as etching, ion implant, or deposition. The present invention is suitable for wafers having very small features or critical dimensions, e.g., sub 100 nm, at 65 nm, or at or less than 45 nm. The low silicon loss feature of the HDIS as disclosed is particularly suitable for very shallow junctions of advanced logic devices. The present invention is also specifically suitable for wafers undergoing front end of the line (FEOL) ion implantation, especially high-dose ion implantation.

The plasma-activated species reacts with the photoresist and sputter residue on the wafer. At the wafer, the reactive gas may include a number of plasma activated species, the inert gas, radicals, charged species, and gas by-products. The volume concentration of various hydrogen species may be about 20-80% of the gas at the wafer. The volume concentration of various fluorine species may be 0.01% to about 2% or less than 1%. The volume concentration of various species from the weak oxidizing agent may be 0.05 to about 5% or about 1.2%. These species may include $H_2^*$, $H_2^+$, $H^+$, $H^*$, $e^-$, OH, $O^*$, CO, $CO_2$, $H_2O$, HF, $F^*$, $F^-$, CF, $CF_2$, and $CF_3$.

Process conditions may vary depending upon the wafer size. In some embodiments of the invention, it is desired to keep the work piece at a particular temperature during the application of plasmas to its surface. Wafer temperatures can range between about 110 degrees and about 500 degrees Celsius. To reduce the likelihood of photoresist popping described above, wafer temperature is preferably increased slowly until enough crust has been removed and photoresist popping ceases to be a concern. Initial station temperature may be about 110 degrees to about 200 degrees Celsius, for example, about 180 degrees Celsius. Later stations can use higher temperatures such as 285 degrees Celsius and about 350 degrees Celsius successfully with good strip rates.

Process Flow

Figure 3:
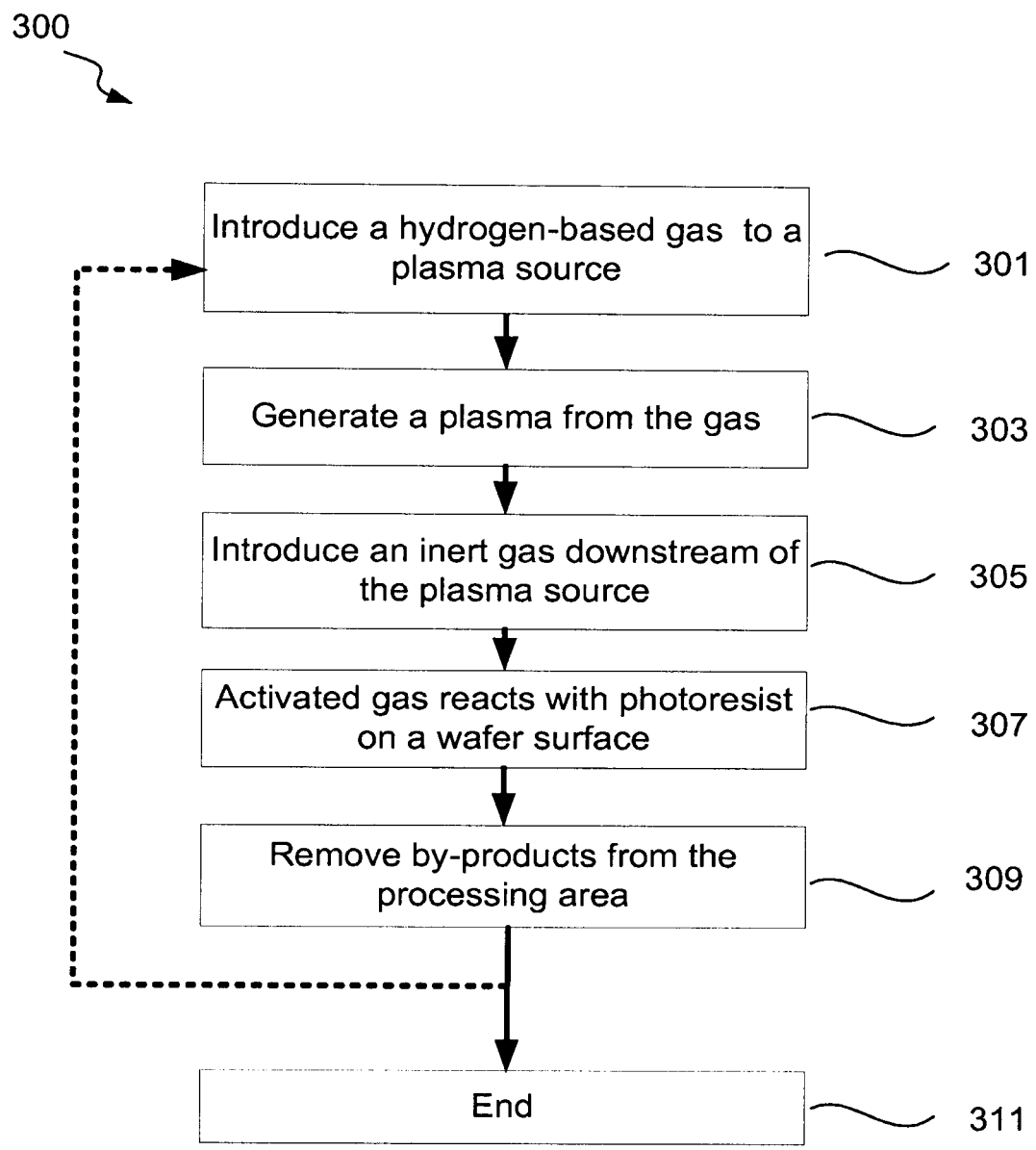
FIG. 3 is a process flow diagram showing various operations in accordance with certain embodiments of the present invention.

FIG. 3 is a process flow diagram showing various operations in accordance with certain embodiments of the present invention. A wafer is positioned in a reaction chamber on a wafer support. At operation 301, a hydrogen-containing gas is introduced to a plasma source. A plasma is generated from the gas in operation 303. As more gas is added to the plasma source, the plasma flows downstream and mixes with an inert gas introduced at operation 305. Some of the charged species in the plasma may combine to form neutral, albeit activated, species. Together, the activated species and the inert gas flow through a showerhead face plate and react with photoresist on a wafer surface at operation 307. The reaction results in volatile by-products that are removed by the processing area with a vacuum pump at operation 309. The process may be repeated one or more times using different process parameters. For example, the wafer may be heated or cooled during iterations of the process. In another example, different initial hydrogen-containing gas and inert gas composition and flow rates may be used. Preferably, at least one of the iterations involves hydrogen-based gas including elemental hydrogen, carbon dioxide, and carbon tetrafluoride. One or more of the iterations may involve hydrogen-containing gas that does not include carbon dioxide or carbon tetrafluoride.

According to various embodiments, the various iterations may be designed to target different portions of the photoresist, for example, the post high-dose implant resist having a crust and bulk resist regions discussed above. The first strip iteration in a first strip station may be designed to strip the crust layer. The first strip iteration may involve generating a plasma using elemental hydrogen, carbon dioxide (or another weak oxidizing agent), and with or without carbon tetrafluoride (or another fluorine containing gas) to specifically strip the crust layer. When the crust layer is sufficiently thin or completely removed, a second strip iteration may strip the bulk resist along with the residue and the remaining crust layer, often at a higher wafer temperature. The second strip process may be performed in a different processing station from the first strip process. The second strip process may employ plasma generated without the weak oxidizing agent or the fluorine containing gas, or both. After the bulk resist is removed, yet another strip process employing different gas compositions may be designed to strip the residue, if any. This residue stripping process may employ a fluorine containing gas to remove any oxidized implant species. The strip iteration described above may be performed in any order or frequency depending on the number of processing stations and the composition of the photoresist to be stripped. One skilled in the art would be able to tailor the concepts discussed herein to strip thicker or thinner crust having lower or higher resistance to the strip chemistry. Further, the concepts discussed herein is applicable to other situations when more than one layer of photoresist having different properties are stripped by different using strip chemistries to target different resist layers.

EXAMPLE 1

In this example, the impacts of carbon dioxide and carbon tetrafluoride on residue were investigated. 300 mm sized wafers were patterned with 45 nm structures and ion implanted with an LDD (lightly doped drain) in the P+ region. The resulting post high dose implant resist was about 2000 angstroms thick with a crust about 630 angstroms thick.

The wafers were stripped in a strip chamber having 5 plasma stations. The plasma was generated with RF power at 2000 Watts. The wafers were exposed to the plasma-activated reactive gas for about 20 seconds at each station for a total of 97 seconds. The wafer support temperature was 350 degrees Celsius. Chamber pressure was 900 mTorr. Hydrogen flow rate was 6 slm (standard liters per minute), and downstream argon flow rate was 14 slm. Carbon dioxide flow rate was varied between 0 and 150 sccm. Carbon tetrafluoride flow rate was varied between 20 and 40 sccm. Note that these flow rates are total flow rates for the entire chamber with 5 plasma stations. Each station receives about ⅕ of the total flow rate.

Figure 4A:
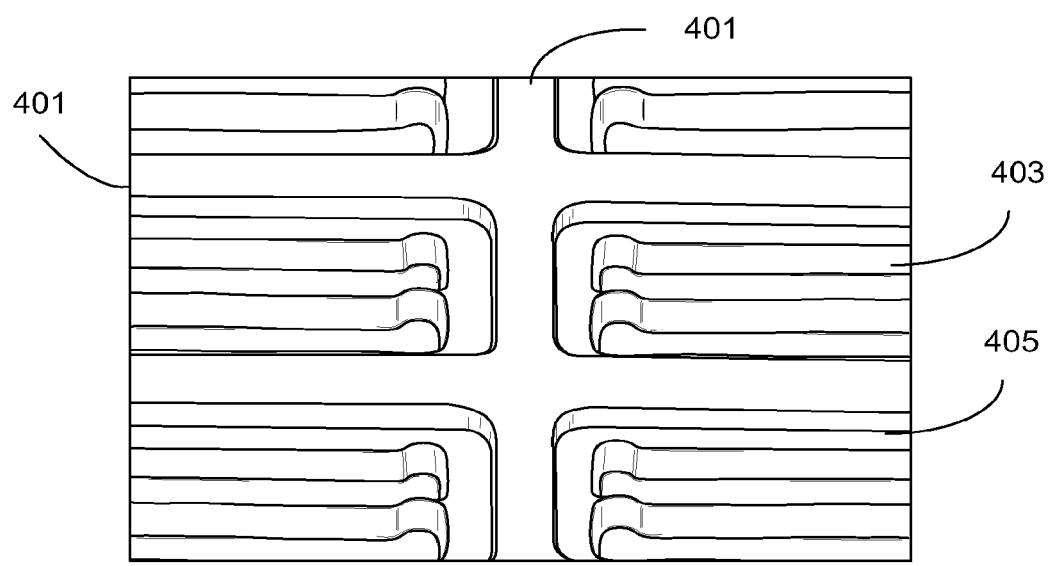
FIGS. 4A to 4D depicts before and after strip SEM photos of photoresist pattern stripped under various conditions in accordance with various embodiments of the present invention.

SEM photos of the wafers before and after stripping with various plasma-activated reactive gases are depicted as FIGS. 4A to 4D. FIG. 4A depicts a small portion of the wafer before stripping. Structure 401 is the post high-dose implant resist. Pads 405 include structures 403 thereon where the photoresist was removed during the patterning process. Thus the HDIS process removes structure 401.

Figure 4B:
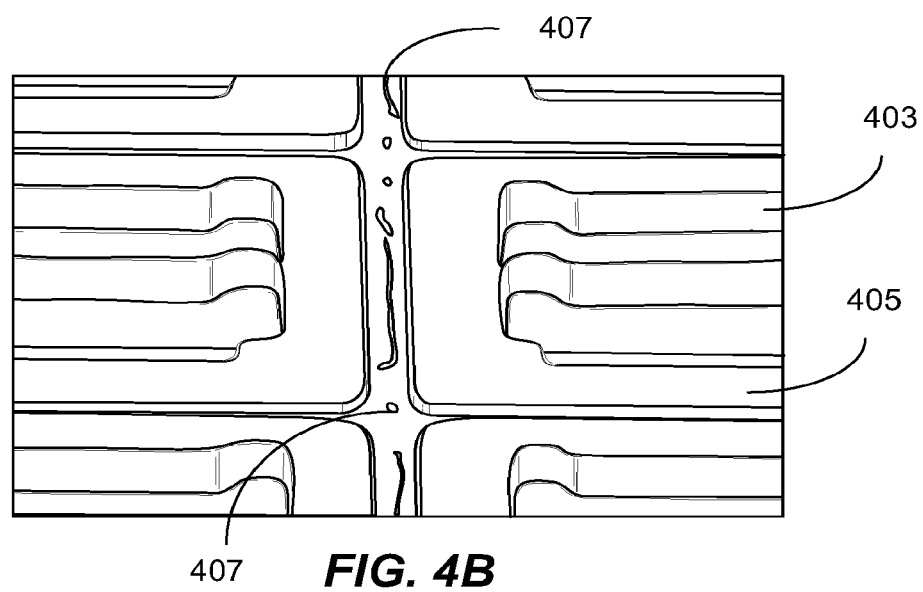
Figure 4C:
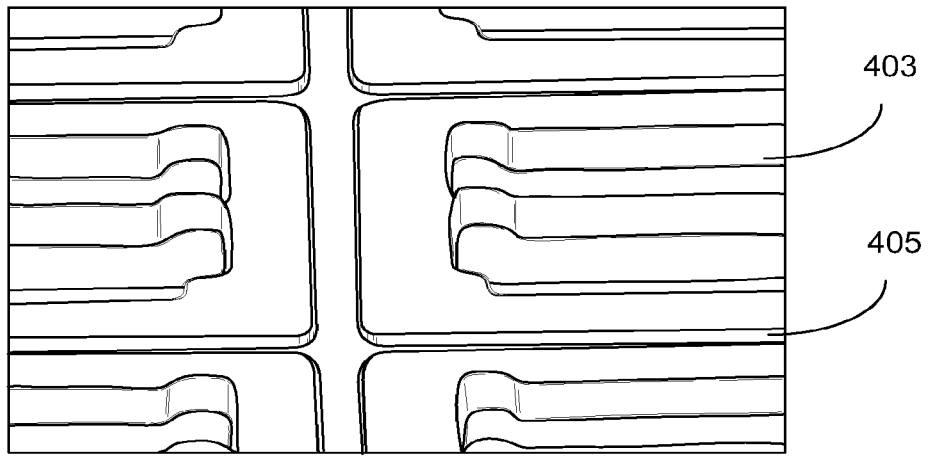
Figure 4D:
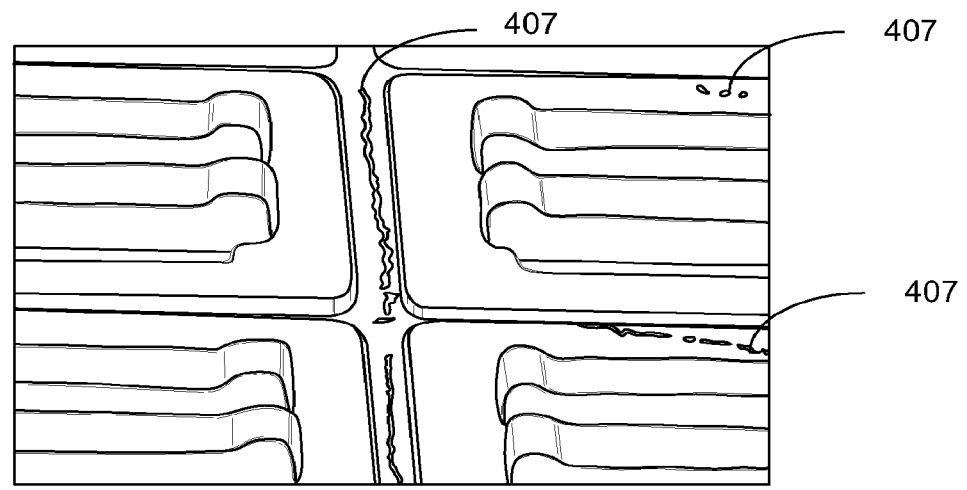

In the first wafer as depicted in FIG. 4B, 20 sccms of carbon tetrafluoride and 150 sccms of carbon dioxide were added to the hydrogen to form the plasma. Worm like residues 407 remained after the process. In the second wafer as depicted in FIG. 4C, 40 sccms of carbon tetrafluoride and 150 sccms of carbon dioxide were added to the hydrogen to form the plasma. The strip resulted in no residue, as shown in FIG. 4C. In yet another wafer as depicted in FIG. 4D, 40 sccms of carbon tetrafluoride and no carbon dioxide was added to the hydrogen to form the plasma. Worm like formation of residue 407 was again observed. This result shows that the addition of carbon dioxide with carbon tetrafluoride can yield residue free film in hydrogen-based HDIS.

EXAMPLE 2

Figure 5A:
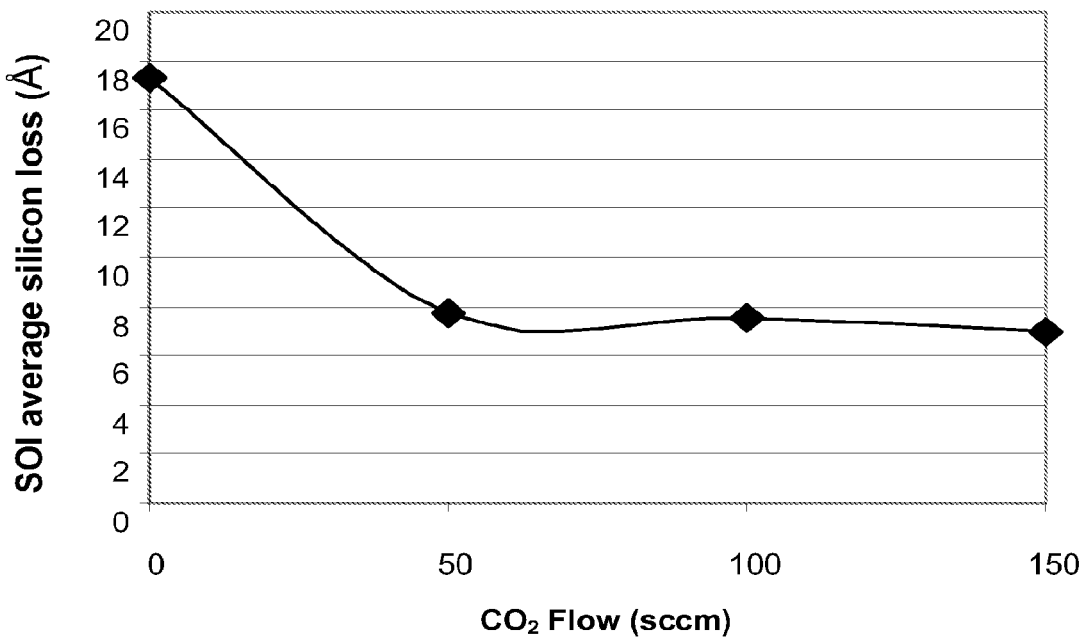
FIG. 5A is a plot of silicon loss for HDIS using various carbon dioxide flow rates in accordance with various embodiments of the present invention.

In this example, the effects of carbon dioxide flow rate and carbon tetrafluoride flow rate on silicon loss were independently examined. Silicon loss for HDIS under the same process conditions as that of Example 1 was measured for carbon dioxide flow rates of 0, 50, 100, and 150 sccm while the carbon tetrafluoride flow rate was held constant at 40 sccm. The results are plotted in FIG. 5A. Silicon loss is lowest at carbon dioxide flow rate of 150 sccm and highest when no carbon dioxide is added. This result shows that some carbon dioxide in the plasma reduces silicon loss.

Figure 5B:
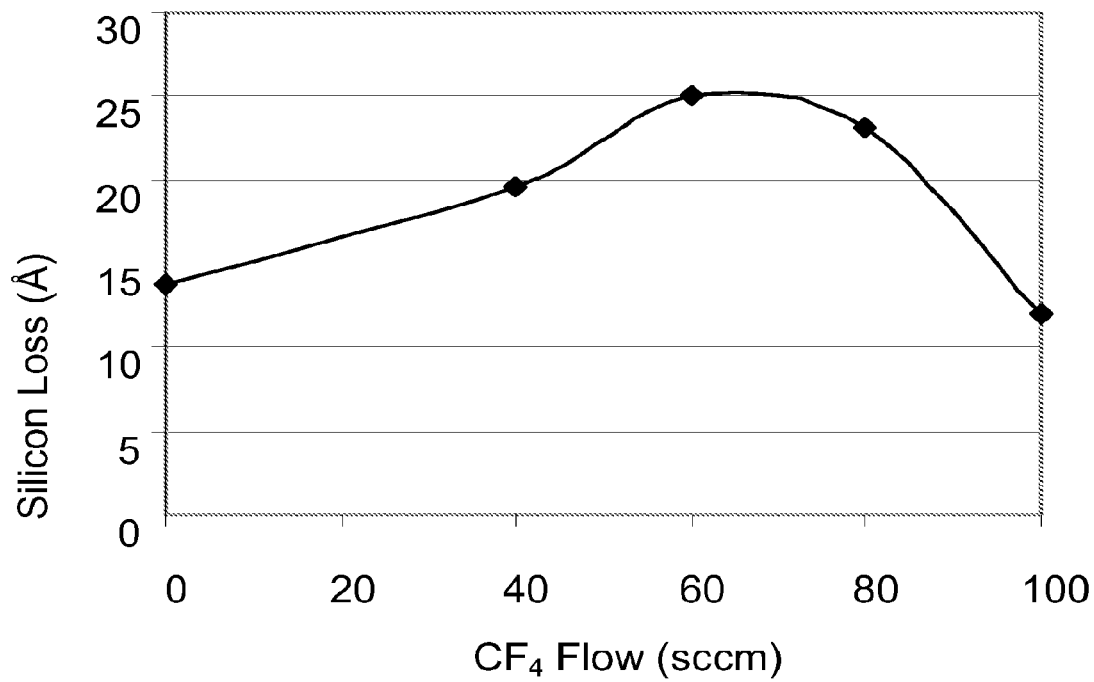
FIG. 5B is a plot of silicon loss for HDIS using various carbon tetrafluoride flow rates in accordance with various embodiments of the present invention.

Silicon loss for HDIS under the same process conditions as that of Example 1 was also measured for carbon tetrafluoride flow rates of 0, 40, 60, 80, and 100 sccm while carbon dioxide flow rate was held constant at 150 sccm. The results are plotted in FIG. 5B. The silicon loss appears to peak at carbon tetrafluoride flow rates of 60 to 80 sccm.

These results show that silicon loss is affected by flow rates of carbon dioxide and carbon tetrafluoride. For a particular film, one skilled in the art would be able to design an HDIS process that minimizes silicon loss and leaves the film residue free.

EXAMPLE 3

In another example, the effect of using different gas compositions at different stations was investigated relative to silicon loss and strip residue. The process conditions were the same as that of Example 1, except that the wafer support temperature is 250 degrees Celsius. In a first recipe, carbon tetrafluoride was employed in all stations at a total flow rate of 40 sccm. In a second recipe, carbon tetrafluoride was delivered only to RF stations 1 and 2 at a total flow rate of 20 sccm (10 sccm per station). Carbon dioxide flow rate was held constant at 150 sccm.

In both cases residue free substrates were obtained after HDIS process. The average silicon losses were 8.1 Å per cycle in the first recipe and 6.7 Å in the second recipe, a reduction of about 17%. A cycle is a complete pass through the tool, including processing at all stations. This result shows that a sequential stripping process using different gas compositions can reduce silicon loss while maintaining residue free substrates.

EXAMPLE 4

In this example, the effect of short process time per station and lower carbon tetrafluoride flow rate was investigated. In the first recipe, no carbon tetrafluoride was added and process time was 20 seconds per station. In the second recipe, carbon tetrafluoride was added at 10 sccm with strip process time of 10 seconds per station. In both recipes the wafer support temperature was 285 degrees Celsius.

In the first recipe, without the carbon tetrafluoride in the plasma, residue was found after the strip. The average silicon loss per cycle was 1.93 Å. In the second recipe, with the reduced carbon tetrafluoride flow and reduced process, the substrate was residue free with an average silicon loss per cycle of 3.12 Å. Although the first recipe had the lower silicon loss, the substrate after the strip was not residue free. This result shows that a reduced carbon tetrafluoride flow rate may be used with shorter process time to yield a residue free substrate.

EXAMPLE 5

In this example, carbon tetrafluoride was introduced into the plasma source at different stations. In the first recipe, 5 sccm of carbon tetrafluoride was introduced in RF station 1. In the second recipe, 5 sccm of carbon tetrafluoride was introduced in RF station 3. Silicon loss was measured after the first cycle and after the fifth cycle and averaged. The other process parameters are the same as that of example 1.

The first recipe yielded a residue free substrate. Silicon loss after the first cycle with carbon tetrafluoride was 14.4 Å. Silicon loss after the fifth cycle was 18.6 Å. The average silicon loss per cycle decreased from 14.4 Å to 3.7 Å.

Small amounts of residue were observed on the substrate after HDIS with the second recipe. Silicon loss after the first cycle was 6.9 Å, less than that of the first recipe. Silicon loss after the fifth cycle was 10.3 Å. The average silicon loss per cycle decreased from 6.9 Å to 2.1 Å.

This result shows that silicon loss using this chemistry is a self-limiting reaction where majority of silicon loss takes place in the first cycle. Additional processing does not remove much more silicon. This is an advantage over the conventional oxygen with fluorine stripping chemistry where total silicon loss is proportional to processing time. In cases where overstripping is necessary, e.g., when photoresist thickness is not uniform, an oxygen chemistry would cause more silicon loss than the hydrogen chemistry as disclosed.

This result also shows that the first cycle silicon loss is reduced if carbon tetrafluoride is not used. One skilled in the art may be able to delay the introduction of carbon tetrafluoride to reduce the total silicon loss.

Note that experimental results for these specific examples are shown to clarify and illustrate the effectiveness of methods of the invention and are not meant to limit the invention to any particular embodiments.

What is claimed is:

1. A method of removing material from a work piece surface in a reaction chamber, the method comprising:
   introducing a gas comprising hydrogen ($H_2$), a weak oxidizing agent, and a fluorine-containing gas into a plasma source;
   generating a plasma from the gas introduced into the plasma source; and
   exposing the material to the plasma to remove the material from the work piece.

2. The method of claim 1, further comprising introducing an inert gas to the plasma via a gas inlet that is downstream of the plasma source and upstream of the work piece.

3. The method of claim 1, wherein the weak oxidizing agent is selected from carbon dioxide, carbon monoxide, nitrogen dioxide, nitrogen oxide, nitrous oxide, and hydrogen peroxide, and combinations thereof.

4. The method of claim 1, wherein the plasma source is upstream of a showerhead in the reaction chamber.

5. The method of claim 4, wherein electrically charged species in the plasma are discharged when they contact the showerhead.

6. The method of claim 1, wherein the gas introduced into the plasma source comprises between about 0.1% to about 1% by volume of the weak oxidizing agent.

7. The method of claim 1, wherein the gas introduced to the plasma source does not comprise oxygen ($O_2$).

8. The method of claim 2, wherein the fluorine-containing gas is selected from carbon tetrafluoride, fluorine, nitrogen trifluoride, and sulfur hexafluoride.

9. The method of claim 2, wherein the fluorine-containing gas is a fluorocarbon.

10. The method of claim 1, wherein the fluorine-containing gas is nitrogen trifluoride.

11. The method of claim 1, wherein the weak oxidizing agent is carbon dioxide.

12. The method of claim 4, wherein the gas inlet is upstream of the showerhead.

13. A method of removing material from a work piece surface in a reaction chamber, the method comprising:
- introducing a gas comprising hydrogen ($H_2$), nitrogen trifluoride, and a weak oxidizing agent into a plasma source, wherein the weak oxidizing agent is selected from the group consisting of carbon dioxide, carbon monoxide, nitrogen dioxide, nitrogen oxide, and water;
- generating a plasma from the gas introduced into the plasma source; and
- exposing the material to the plasma to remove the material from the work piece.

14. The method of claim 13, further comprising introducing an inert gas to the plasma via a gas inlet that is downstream of the plasma source.

15. The method of claim 13, wherein the weak oxidizing agent is about 0.1% to 10% by volume of the weak oxidizing agent.

* * * * *